United States Patent [19]

Bredenkamp

[11] Patent Number: 4,684,879

[45] Date of Patent: Aug. 4, 1987

[54] TRANSISTOR BASE DRIVE CIRCUIT

[75] Inventor: Gordon L. Bredenkamp, Johannesburg, South Africa

[73] Assignee: Crucible, Societe Anonyme, Gerondins, Luxembourg

[21] Appl. No.: 879,483

[22] Filed: Jun. 27, 1986

[30] Foreign Application Priority Data

Jun. 28, 1985 [ZA] South Africa .................. 85/4899

[51] Int. Cl.[4] .................. G05F 1/46; H02P 13/18
[52] U.S. Cl. .................. 323/289; 363/97
[58] Field of Search .............. 323/289, 282, 285, 351; 307/270, 280, 300; 363/97

[56] References Cited

U.S. PATENT DOCUMENTS

T950,004  9/1976  Tuttle .................. 323/289
3,492,503  1/1970  Bose .................. 323/289 X

OTHER PUBLICATIONS

Hoffman, Jr. et al., "Transistor Fast Turnoff Insensitive to Drive Transition", *IBM Technical Disclosure Bulletin*, vol. 17, No. 4, Sep. 1974, pp. 1089-1090.

Palmucci, "Switching Regulator with Transistor Turn-off", *IBM Technical Disclosure Bulletin*, vol. 16, No. 4, Sep. 73, p. 1161.

*Primary Examiner*—Peter S. Wong
*Attorney, Agent, or Firm*—Irvin A. Lavine

[57] ABSTRACT

A base drive circuit for a transistor which includes a transformer with a primary winding and a secondary winding, a base drive source, and first and second diodes, the primary winding being connected to the source and to the collector of the transistor by means of the first diode, the secondary winding having a first terminal which is connected to the emitter of the transistor, a second terminal which is connected to the collector of the transistor by means of the second diode, and a tap which is connected to the base.

5 Claims, 1 Drawing Figure

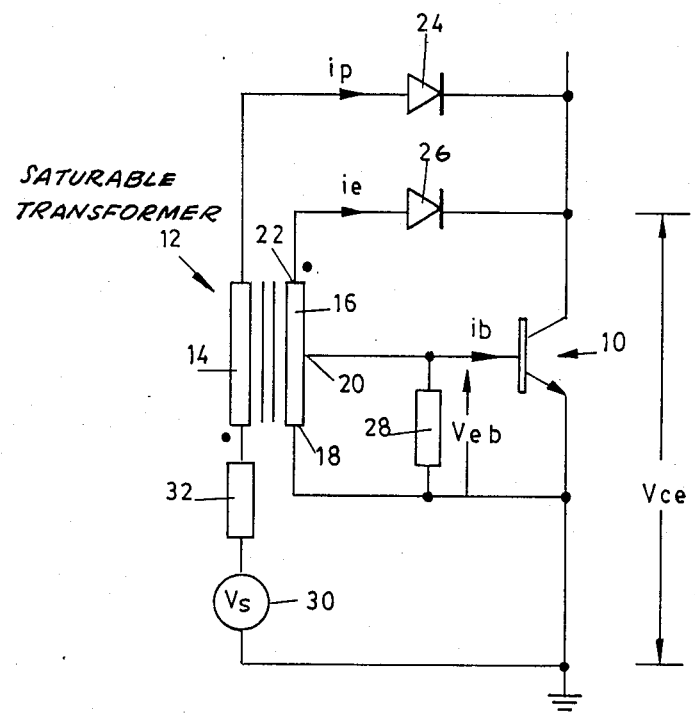

TRANSISTOR BASE DRIVE CIRCUIT

BACKGROUND OF THE INVENTION

This invention relates generally to the switching of transistors and particularly to the switching of power transistors.

When power transistors are used in switched mode power electronic circuits such as regulators and inverters it is essential, for satisfactory operation, to ensure that the collector current-voltage excursions of the transistors, during switching, are kept well within the safe operating areas of the transistors.

These safe operating parameters are generally well known and many techniques have been proposed for ensuring that they are complied with during transistor switching. Thus various types of snubber circuits are known for achieving the necessary variation in load conditions between transistor turn-on and turn-off.

It is also known to make use of a resonance commutated circuit, for example in half or full-bridge invertors, to generate collector voltage variations so that selected transistors may be switched at substantially zero collector-emitter voltages.

Yet another arrangement which has been proposed is the so-called collector catcher circuit wherein the base drive source is connected to the base and collector of the transistor by means of a plurality of diodes.

In many respects the techniques which have been referred to, or variations thereof, are highly satisfactory but such techniques are often implemented at the cost of complexity.

It is known that a base drive for a transistor operating in a resonance commutated system should possess the following properties:

(1) during the on-state the base current should maintain $V_{ce}$ (collector-emitter voltage) as low as possible, but without driving the transistor into saturation;

(2) at turn-off the base should be driven negative as fast as possible to ensure efficient turn-off;

(3) the transistor should be prevented from being turned on unless $V_{ce}$ is below a predetermined value, and (4) the transistor should be turned off should $V_{ce}$ rise above some predetermined value.

German Auslegeschrift No. 1 257 842 discloses a circuit which achieves the first of these objectives. The remaining objectives are, however, not addressed.

SUMMARY OF THE INVENTION

It is an object of the present invention to provide an improved base drive circuit.

The invention provides a base drive circuit for a transistor which includes a transformer with a primary winding and a secondary winding, a base drive source, and first and second unidirectional current conducting means, the primary winding being connected to the source and to the collector of the transistor by means of the first unidirectional current conducting means, the secondary winding having a first terminal which is connected to the emitter of the transistor, a second terminal which is connected to the collector of the transistor by means of the second unidirectional current conducting means, and a tap which is connected to the base.

In a preferred embodiment of the invention, in the secondary winding, the ratio of the number of turns between the tap and the first terminal to the number of turns between the tap and the second terminal is 1:2. Other ratios may be employed for other applications, however, and the use of different ratios is also within the scope of the invention.

Means may be provided for dissipating excess magnetisation energy in the transformer. This dissipating means preferably takes the form of a resistor which is connected between the first terminal of the secondary winding and the tap.

The first and second unidirectional current conducting means are preferably diodes.

The invention is also intended to extend to power circuits such as regulators and inverters which include transistors with base drive circuits of the kind described. With this application the transformer may be saturable so as to initiate turn-off of the transistor after a predetermined "on" time and, preferably, the base drive source comprises a feed back signal derived from an output signal of the transistor.

BRIEF DESCRIPTION OF THE DRAWING

The invention is further described by way of example with reference to the accompanying drawing which illustrates a power transistor base drive circuit according to the invention.

DESCRIPTION OF PREFERRED EMBODIMENT

The accompanying drawing illustrates a power transistor 10, a transformer 12 which includes a primary winding 14 and a secondary winding 16, the secondary winding including a first terminal 18 which is connected to the emitter of the transistor, a tap 20 which is connected to the base of the transistor and a second terminal 22, a first diode 24 which connects one terminal of the primary winding to the collector of the transistor, a second diode 26 which connects the second terminal of the secondary winding to the collector of the transistor, a resistor 28 connected between the first terminal 18 and the tap 20 of the secondary winding, a base drive source 30 and a resistor 32 which connects the source 30 to the primary winding.

The polarities of the voltages in the transformer 12 during operation are designated in a conventional manner by means of dots.

On the secondary winding the ratio of the number of turns between the first terminal 18 and the tap 20 to the number of turns between the tap 20 and the second terminal 22 is 1:2.

In operation of the circuit the voltage across the lower section of the secondary winding i.e. across the tap 20 and the first terminal 18, is the emitter base voltage of the transistor $V_{eb}$. Thus, due to the fact that there is a 1:2 turns ratio between the lower and upper sections of the secondary winding the total voltage across the secondary winding is 3 $V_{eb}$. Assume that the transistor 10 is on and that the base current $i_b$ is large so that the collector emitter voltage, $V_{ce}$, has a tendency to decrease to the point where the transistor saturates. When the voltage $V_{ce}$ drops below 2 $V_{eb}$, and bearing in mind that the forward volt drop across the diode 26 is of the order of $V_{eb}$, current flow $i_e$ takes place through the diode 26 and the secondary winding voltage is reduced. The emitter base voltage of the transistor, $V_{eb}$, is also reduced, leading to a decrease in the base current $i_b$ and this, in turn, checks the drop in the collector-emitter voltage $V_{ce}$. The operation of the circuit described thus far is that of a negative feed back loop which stabilises the collector emitter voltage $V_{ce}$ at a value above the saturation level.

When the transistor 10 is on magnetisation current builds up in the primary winding 14 of the transformer. At turn-off the total primary current, designated $i_p$, which includes the load current and the magnetisation current, is interrupted. The secondary load current which includes the base current $i_b$ and the excess current $i_e$ flowing to the collector also stops. The magnetic energy which is stored in the transformer tends to maintain the magnetisation current which is transferred to the secondary appearing as a negative base current. This negative base current discharges the transistor and causes the transistor to turn off very abruptly, thereby limiting the turn-off dissipation to a very low value.

After the discharge action is completed any excess magnetisation energy is dissipated in the resistor 28, and the transformer is returned to its zero energy state before the start of the next "on" cycle. The base-emitter junction is also held in a reverse biased state for the rest of the turn-off cycle, which helps prevent any spurious turn-on pulses from occuring due to parasitic effects.

The transistor is prevented from being turned on unless the collector emitter voltage $V_{ce}$ is below a predetermined value. This action is achieved by the coupling of the primary winding 14 to the transistor collector by means of the diode 24. This diode becomes forward biased only when the collector-emitter voltage $V_{ce}$ drops below the voltage $V_s$ of the base drive source 30. Premature turn on of the transistor is thereby inhibited. The resistor 32 is used to set the primary current $i_p$ to its required value with $V_{ce}=2\ V_{eb}$.

If the collector-emitter voltage $V_{ce}$ rises due to the collector current $i_c$ becoming too high, or due to the base current $i_b$ dropping too low, then the transistor is turned off due to the positive feed back action which is set up via the diode 24, the transformer primary winding 14, the base drive winding and the transistor. The feed back causes the collector-emitter voltage $V_{ce}$ to rise further reverse biasing the diode 24. The primary current $i_p$ is interrupted and the magnetisation current is transferred to the base circuit thereby completing the turn-off cycle as previously described.

It follows that the base drive circuit of the invention provides the desired characteristics set out in the preamble of the specification.

The circuit of the invention lends itself particularly to use with power transistors in regulators and inverters. In a free running or self-oscillating inverter circuit the base drive transformer may also provide the timing function which determines the operating frequency of the system. This is achieved by designing the base drive transformer so that its core saturates after a predetermined "on" time, causing the forward base current to drop sharply at this point. This initiates the turn-off cycle as described above. In this case the base drive source may be a feed back winding on a transformer which forms at least part of the load of the transistor.

When the base drive circuit of the invention is used with a full bridge inverter then, instead of having one snubber capacitor coupled directly across the primary winding of the load transformer, as is conventionally done, two capacitors of double the value may be coupled from each side of the load to the system ground. This eliminates the need for diagonally opposed base drive circuits to be cross-coupled to ensure simultaneous switching of the two transistors in question. The two sides of the full bridge inverter may be regarded as two independent half bridge circuits which are forced to operate synchronously due to the resonant swinging of the load voltage during commutation and the action of the collector voltage interlocks.

A number of variations can be incorporated in the invention. For example the resistor 32, which fulfils a current limiting role, could be replaced, or alternatively be supplemented, by a resistor in the secondary winding e.g. between the tap 20 and the base of the transistor. The retention of the resistor 32 in the primary winding carries with it the benefit of limiting the primary winding current when the transistor goes into saturation. Another possibility is to replace the resistor 32 by an electronic current limiting device which limits the current in the primary winding when the voltage across the device reaches a predetermined value.

It has already been pointed out that the winding ratio in the secondary winding is 1:2. However other ratios are usable depending on application and on transistor parameters.

I claim:

1. A base drive circuit for a transistor which includes a transformer with a primary winding and a secondary winding, a base drive source, and first and second unidirectional current conducting means, the primary winding being connected to the source and to the collector of the transistor by means of the first unidirectional current conducting means, the secondary winding having a first terminal which is connected to the emitter of the transistor, a second terminal which is connected to the collector of the transistor by means of the second unidirectional current conducting means, and a tap which is connected to the base.

2. A circuit according to claim 1 wherein, in the secondary winding, the ratio of the number of turns between the tap and the first terminal to the number of turns between the tap and the second terminal is 1:2.

3. A circuit according to claim 1 which includes a resistor which is connected between the first terminal of the secondary winding and the tap.

4. A circuit according to claim 1 wherein the transformer is saturable so as to initiate turn-off of the transistor after a predetermined "on" time.

5. A circuit according to claim 4 wherein means are provided for connecting the base drive source to the emitter of the transistor.

* * * * *